United States Patent [19]

Batchman et al.

[11] Patent Number: 4,642,558

[45] Date of Patent: Feb. 10, 1987

[54] MINIATURE ELECTROMAGNETIC FIELD MEASUREMENT PROBE

[75] Inventors: Theodore E. Batchman; George E. Gimpelson, both of Charlottesville, Va.

[73] Assignee: Univ. of Virginia Alumni Patents Found., Charlottesville, Va.

[21] Appl. No.: 481,389

[22] Filed: Apr. 1, 1983

[51] Int. Cl.[4] .............................................. G01R 31/00
[52] U.S. Cl. .................................... 324/72.5; 324/95; 128/653
[58] Field of Search ............................ 324/72.5, 72, 95; 128/422, 653, 734, 804; 343/703; 174/117 FF, 117 PC

[56] References Cited

U.S. PATENT DOCUMENTS

| 3,541,473 | 11/1970 | Schlicke et al. | 174/117 FF |
| 3,794,914 | 2/1974 | Aslan | 324/95 |
| 3,931,573 | 1/1976 | Hopfer | 324/95 |
| 4,277,744 | 7/1981 | Audone et al. | 324/72 |
| 4,317,078 | 2/1982 | Weed et al. | 128/653 |

Primary Examiner—Stewart J. Levy
Assistant Examiner—Kevin D. O'Shea
Attorney, Agent, or Firm—John J. Byrne; Bradford E. Kile

[57] ABSTRACT

An electromagnetic field measurement probe for measuring an electromagnetic field and providing a corresponding measurement signal to a measurement output. The electromagnetic field measurement probe comprises an antenna arrangement for detecting the electromagnetic field and producing a corresponding electrical output, and an output connector arrangement connected to the antenna arrangement for providing the corresponding electrical output to the measurement output of the probe. The output connector arrangement includes a lead structure comprising a dielectric having opposing faces on opposite sides thereof, and high resistivity lead material disposed on the opposing faces. The probe further comprises a diode rectifier disposed between and connecting two antenna elements forming the antenna arrangement, as well as two output connector bonding pads, each being electrically connected to the high resistivity material disposed on respective ones of the two opposing faces of the dielectric.

10 Claims, 3 Drawing Figures

MINIATURE ELECTROMAGNETIC FIELD MEASUREMENT PROBE

DESCRIPTION

TECHNICAL FIELD

The present invention relates to a miniature electromagnetic field measurement probe, and more particularly a miniature probe for measuring electromagnetic field interference in electronic equipment, measurement of microwave fields for determination of safe radio frequency (RF) radiation levels, monitoring personal RF radiation, in vivo measurement of RF fields, included but not limited to measurements during the treatment of tumors by diathermy, and mapping microwave antenna patterns.

BACKGROUND ART

Present-day microwave electric field (E-field) measurement probes are undesirably large (greater than 1.5 mm.), are not linear over a larger range of microwave power values, and do not have antenna patterns which are independent of the lead structure. Accordingly, such present-day measurement probes are burdened by inflexibility, in terms of the applications to which they may be put, and also yield results which are undesirably inaccurate. In addition, measuring probes of the prior art are quite sensitive to stray radiation and noise, and this leads to measurement results which are further distorted and inaccurate.

Typical among measurement probes of the prior art is the microwave leakage detector disclosed in Newman—U.S. Pat. No. 4,338,595. The microwave leakage detector disclosed therein comprises a dipole antenna having arms or sections, with a diode inserted between the respective arms or sections. In the arrangement of Newman, leads connect respective sides of the diode to a light-emitting diode. It is stated that the detector disclosed in this patent can be utilized to determine whether a microwave oven, or any other device, is leaking radiation beyond the limits imposed by the Food and Drug Administration.

Nevertheless, the microwave leakage detector disclosed in the aforementioned patent does not have the flexibility which would permit it to be used not only for determining whether a microwave oven, or any other device, is leaking radiation beyond prescribed limits, but also for in vivo measurement of RF fields during the treatment of tumors by diathermy, and other similar medical applications, as well as other applications in general. Furthermore, the microwave leakage detector disclosed in the aforementioned patent is burdened by some of the other disadvantages of arrangements of the prior art, as described above.

Other arrangements of the prior art which are of general background interest with respect to the development of electromagnetic field measurement probes are described in the following U.S. patents: Carney—U.S. Pat. No. 3,460,528; Brown et al—U.S. Pat. No. 3,555,529; Jacobi et al—U.S. Pat. No. 4,162,500; Aaby et al—U.S. Pat. No. 4,344,440; Lamb—U.S. Pat. No. 2,517,325; Richardson—U.S. Pat. No. 3,063,010; Berman—U.S. Pat. No. 2,321,356; and Wing—U.S. Pat. No. 2,436,538.

The following publications are also generally pertinent relative to field measurement probe arrangements of the prior art:

(1) Bassen, H. "A Broad-band Miniature Isotropic Electric Field Measurement System", in 1975 IEEE Electromagnetic Compatibility Symp. Rec., IEEE Publ. 75 CH1002-5 EMC, pp. 5BIIa (1–5), October 1975.

(2) Bassen, H., Swicord, M., Abita, J. "A Miniature, Broadband Electric Field Probe". Ann NY Acad Sci 247:481-486 (February 1975).

(3) Bassen, H. "Internal Dosimetry and External Microwave Field Measurements Using Miniature Electric Field Probes," Symposium on Biological Effects and Measurements of Radio Frequency/Microwaves, HEW Publication (FDA) 77-8026, July 1977, pp. 136–151.

(4) Green, F. "Development of Electric and Magnetic Near Field Probes," NBS Tech. Note 658, January 1975.

(5) Kanda, M., Riese, F. X., and Belsher, D.R. "A Broadband, Isotropic, Real-Time, Electric-Field Sensor (BIRES) Using Resistively Loaded Dipoles," NBSIR 79-1622, (U.S.), National Bureau of Standards, December 1979.

(6) Kanda, M. "The Characteristics of Broadband, Isotropic, Electric-Field and Magnetic-Field Probes," NBSIR 77-868 (U.S.), National Bureau of Standards, November 1977.

(7) Kanda, M., and Ries, F.X. "Dipole-Based EM Probe Grabs Complex Fields," Microwaves, January 1981, pp. 63–66.

DISCLOSURE OF INVENTION

The present invention relates to an electromagnetic field measurement probe for measuring an electromagnetic field and providing a corresponding measurement signal to a measurement probe output.

More specifically, the electromagnetic field measurement probe comprises an antenna arrangement for detecting the electromagnetic field and producing a corresponding electrical output, and an output connector arrangement connected to the antenna arrangement for providing the corresponding electrical output thereof to the measurement probe output, the output connector arrangement including a lead structure comprising a dielectric having opposing faces, and high resistivity lead material disposed on the opposing faces of the dielectric.

In a preferred embodiment of the electromagnetic field measurement probe, the antenna arrangement comprises two antenna elements, each antenna element being electrically connected to the high resistivity lead material disposed on a respective one of the opposing faces of the dielectric, and a diode rectifier disposed between and connecting the two antenna elements.

The output connector arrangement preferably comprises a substrate on which the lead structure is disposed, and further comprises two output connector bonding pads, each output connector bonding pad being electrically connected, remote from the two antenna elements, to the high resistivity material disposed on a respective one of the opposing faces of the dielectric.

In a further preferred embodiment of the electromagnetic field measurement probe, the antenna arrangement comprises an antenna which has an angle of tilt which is variable in dependence on whether the probe is being used for single-axis measurements or for three-axis vectorial field measurements.

Finally, the electromagnetic field measurement probe is preferably entirely encapsulated in a dielectric material of relatively low permittivity so that the probe is rendered media-independent.

Therefore, it is a primary object of the present invention to provide an electromagnetic field measurement probe for measuring an electromagnetic field in free space, and in vivo (tissue) and providing a corresponding measurement signal to a measurement probe output thereof.

It is an additional object of the present invention to provide an electromagnetic field measurement probe comprising an antenna arrangement for detecting the electromagnetic field and producing a corresponding electrical output, and an output connector arrangement for providing the corresponding electrical output of the antenna arrangement to a measurement probe output of the probe.

It is an additional objective of the instant invention to provide a combined low pass filter and transmission means as part of an electromagnetic field measurement probe.

It is an additional object of the present invention to provide an electromagnetic field measurement probe having an output connector arrangement comprising a lead structure which includes a dielectric having opposing faces, and high resistivity lead material disposed on the opposing faces of the dielectric.

It is an additional object of the present invention to provide an electromagnetic field measurement probe having an antenna arrangement comprising two antenna elements, each electrically connected to high resistivity lead material disposed on respective opposing faces of a dielectric.

It is an additional object of the present invention to provide an electromagnetic field measurement probe having a diode rectifier disposed between and connecting two antenna elements of an antenna arrangement of the probe.

It is an additional object of the present invention to provide an electromagnetic field measurement probe having two output connector bonding pads, each being electrically connected, remote from the antenna arrangement of the probe, to high resistivity lead material disposed on respective opposing faces of a dielectric of the probe.

It is an additional object of the present invention to provide an electromagnetic field measurement probe having an antenna arrangement comprising an antenna which has an angle of tilt which is variable in dependence on whether the probe is used for single-axis measurements or three-axis vectorial field measurements.

It is additional object of the present invention to provide an electromagnetic field measurement probe which is entirely encapsulated in a dielectric material of relatively low permittivity.

With the above and other objects in mind, as will hereinafter appear, the invention will now be more clearly understood by reference to the following detailed description, the accompanying drawings and the appended claims.

BEST MODE FOR CARRYING OUT THE INVENTION

Figure 1:
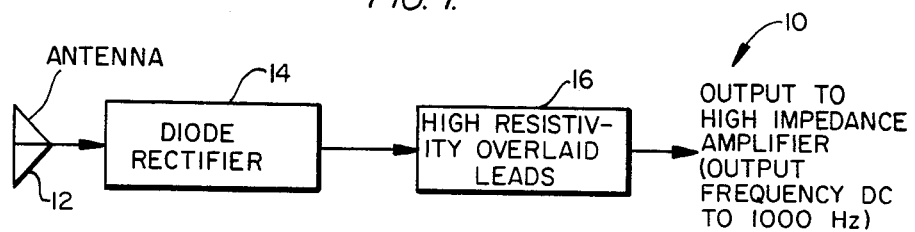
FIG. 1 is a block diagram of the electromagnetic field measurement probe of the present invention.

FIG. 1 is a block diagram of the electromagnetic field measurement probe of the present invention. As seen therein, the electromagnetic field measurement probe 10 basically comprises an antenna arrangement 12, diode rectifier 14, and high resistivity leads 16, connected in sequence, the leads 16 being connected, as the measurement output of the probe, to a high impedance amplifier (not SHOWN).

The antenna arrangement 12 detects the electromagnetic field being measured by the probe, and produces a corresponding electrical output, which is provided to diode rectifier 14. It is to be understood that the antenna arrangement 12 can be designed to detect and/or measure an electric field (by use of a dipole antenna), a magnetic field (by use of a loop antenna), or the field power (by use of a combined dipole-loop antenna).

Diode rectifier 14 comprises a non-linear device, such as a semiconductor diode which may be electrically biased or unbiased, which rectifies the antenna output signal to provide a rectified signal to the high resistivity leads 16. Leads 16 convey this signal to the measurement output of the electromagnetic field measurement probe, typically connected to a high impedance amplifier (not shown) having an output frequency (DC) of up to 1000 Hz.

Figure 2:
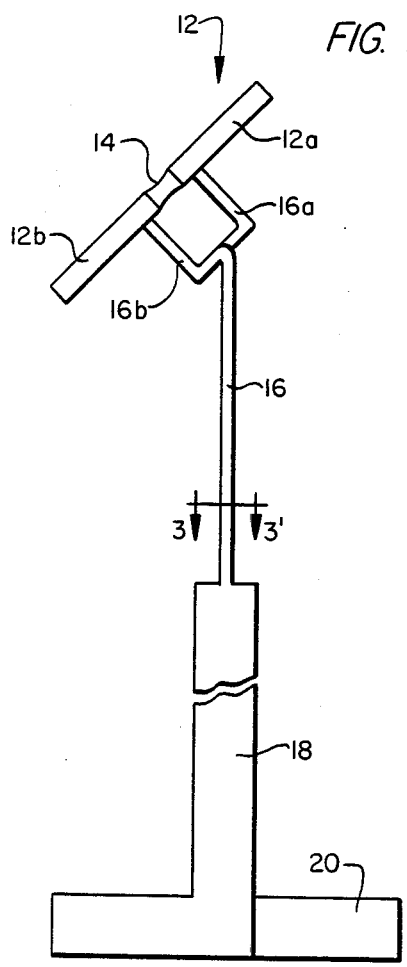
FIG. 2 is a structural diagram of the electromagnetic field measurement probe of the present invention.
Figure 3:
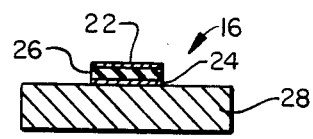
FIG. 3 is a cross-sectional view of the lead structure of the electromagnetic field measurement probe of the present invention.

FIG. 2 is a structural diagram of the electromagnetic field measurement probe of the present invention, while FIG. 3 is a cross-sectional view of the lead structure of the electromagnetic field measurement probe, such cross-sectional view being taken along section line 3–3' of FIG. 2.

As seen in FIG. 2, the electromagnetic field measurement probe 10 comprises an antenna arrangement 12 (including separate antenna elements 12a and 12b), diode rectifier 14, lead structure 16, and output connector bonding pads 18 and 20.

Antenna elements 12a and 12b are seen to be connected electrically by diode rectifier 14, each antenna element 12a and 12b being connected by means of a respective lead portion 16a and 16b to the overall lead structure 16.

Output connector bonding pads 18 and 20 are connected, at one end, to the lead structure 16, and are connected at the other end to the output amplifier (not shown) previously mentioned.

As seen in the cross-sectional view of FIG. 3, the lead structure 16 comprises a dielectric 26 having opposing faces, on which opposing faces respective layers 22 and 24 of high resistivity lead material are disposed. The arrangement consisting of the high resistivity lead material layers 22 and 24, as well as the dielectric 26, can be constructed on, and is disposed on, a substrate 28. Referring back to FIG. 2, respective lead portions 16a and 16b are connected to corresponding layers 22 and 24, respectively, of high resistivity lead material, while the corresponding respective layers 22 and 24 of high resistivity lead material are connected to output connector bonding pads 18 and 20, respectively.

As seen in FIGS. 2 and 3, the lead structure 16 comprises a sandwich-type structure having a sufficiently high electrical capacitance to filter out unwanted frequencies (for example, frequencies above 1000 Hz.), and to prevent the leads from acting as a magnetic field antenna. Moreover, the resistivity of the high resistivity lead material making up the lead structure 16 is larger than 1000 ohms per square so as not to perturb the fields under investigation and being measured, or to act as an electric field antenna.

The capacitance of the lead structure 16 is controlled by controlling the relative permittivity and the thickness of the dielectric 26. The high resistivity lead material layers 22 and 24 are, preferably, made of metal compounds exhibiting high electrical resistance. The wide area of the lead structure 16c (away from the antenna arrangement 12 and diode rectifier 14) can be used to match the impedance of the probe 10 to that of the instrument amplifier (not shown) such that matched impedance can be varied up to a value in excess of 100 megohms.

As can be seen by referring to FIG. 2, the antenna arrangement 12 has an angle of tilt, the term "angle of tilt" being defined as the angle (indicated in FIG. 2 by the Greek letter "phi") between the lengthwise axis of the lead structure 16, on the one hand, and a line drawn from the antenna end of the lead structure 16 through the diode rectifier 14 (located between antenna portions 12a and 12b), on the other hand. In accordance with a preferred embodiment of the present invention, the angle of tilt of the antenna arrangement 12 can be varied from 0° to 36°, depending on whether the probe is to be used for single-axis measurements (phi=0°) or three-axis vectorial field measurements (phi=36°).

Further referring to FIG. 3, the lead structure 16, and in particular high resistivity lead material layers 22 and 24, as well as dielectric 26, can be constructed and disposed on any dielectric substrate 28 of low relative permittivity ($e_r$ less than 4). Moreover, in accordance with a further preferred embodiment of the invention, the entire assembly of the field measurement probe (that is, the antenna arrangement 16) is encapsulated within a dielectric material of low value ($e_r$ less than 4), thus making the probe 10 media-independent.

To summarize, whereas present microwave electromagnetic or electric field measurement probes are relatively large (dimensions greater than 1.5 mm), are not linear over a large range of microwave powers, and do not have antenna patterns which are independent of lead structure, the above-described inventive electromagnetic field measurement probe has the following advantages over probes of the prior art, primarily resulting from the unique lead structure of the inventive probe: (1) The lead structure 16 is formed of material of high resistivity (greater than 1000 ohms per square) such that the lead structure 16 is transparent to microwave radiation, and the overall measurement system does not perturb the field being measured by the probe 10. (2) The probe of the present invention is much smaller than probes of the prior art, the inventive probe having dimensions on the order of 1 mm. (3) The inventive probe has a linear response, with input power, from 1 mw/cm$^2$ to 300 mw/cm$^2$. (4) The antenna pattern of the inventive probe is not perturbed by the lead structure 16 thereof. (5) The probe 10 of the present invention can be used for in vivo measurements without doing damage to the body being measured. (6) The lead structure 16 of the inventive probe is insensitive to stray radiation and to environmental noise. (7) Finally, the signal transmission cut-off frequency of the lead structure 16 in the inventive probe can be made extremely low (less than 30 Hz.).

Among the practical applications to which the inventive electromagnetic field measurement probe can be put are the following: (1) measurement of electromagnetic interference in electronic equipment; (2) measurement of microwave fields in the determination of safe RF radiation levels; (3) personal RF radiation monitoring; (4) in vivo measurement of RF fields, including but not limited to measurements during treatment of tumors by diathermy; and (5) microwave antenna pattern mapping.

While preferred forms and arrangements have been shown in illustrating the invention, it is to be clearly understood that various changes in detail and arrangement may be made without departing from the spirit and scope of this disclosure.

We claim:

1. An electromagnetic field measurement probe for measuring electromagnetic fields in free space and in vivo (tissue), comprising:
    antenna means for detecting electromagnetic field and producing a corresponding electrical output;
    combined transmission and low pass filter means for filtering said electrical output and transmitting said filtered electrical output;
    said transmission and low pass filter means including a lead structure having a dielectric center with opposing faces on which a layer of high resistivity lead material is respectively deposited;
    said low pass filter and said transmission means being encapsulated on a dielectric substrate of relatively low permeativity ($e_r$ less than 4) for enabling precise measurements in-vivo;
    said antenna means including two antenna elements respectively connected to a corresponding said layer of high resistivity lead material.

2. The probe of claim 1, further comprising:
    a diode rectifier connecting said two antenna elements.

3. The probe of claim 1, wherein:
    said combined transmission and low pass filter means further comprises two output connector bonding pads, each said output connector bonding pad being electrically connected, remote from said two antenna elements, to the high resistivity lead material disposed on a respective one of said opposing faces.

4. The probe of claim 2, wherein said output connector means further comprises two output connector bonding pads, each said output connector bonding pad being electrically connected, remote from said two antenna elements, to the high resistivity lead material disposed on a respective one of said opposing faces.

5. The probe of claim 1, wherein said high resistivity lead material has a resistivity larger than 1,000 ohms per square, whereby the lead structure is transparent to microwave radiation and the measurement probe does not perturb the electromagnetic probe being measured.

6. The probe of claim 1, wherein said high resistivity lead material is metallic.

7. The probe of claim 1, wherein:
    said lead structure of said transmission and low pass filter means is connected to a high impedance amplifier;
    said high impedance amplifier having an input impedance matched to the impedance of said lead structure for providing maximum power transfer.

8. The probe of claim 1, wherein:
    said antenna means comprises an antenna which has an angle of tilt which is variable depending on whether the probe is used for single-axis measurements or three-axis vectorial field measurements.

9. The probe of claim 1, wherein said antenna means tilts at a fixed angle of approximately zero degrees in a single axis probe arrangement.

10. The probe of claim 1, wherein:
    said antenna means tilts at a fixed angle in a three axis vectorial field measurement arrangement.

* * * * *